(12) United States Patent
Talja

(10) Patent No.: US 7,724,503 B2
(45) Date of Patent: May 25, 2010

(54) FREQUENCY CONVERTER

(75) Inventor: Markku Talja, Järvenpää (FI)

(73) Assignee: ABB Oy, Helsinki (FI)

( * ) Notice: Subject to any disclaimer, the term of this patent is extended or adjusted under 35 U.S.C. 154(b) by 419 days.

(21) Appl. No.: 11/902,468

(22) Filed: Sep. 21, 2007

(65) Prior Publication Data

US 2008/0084148 A1 Apr. 10, 2008

(30) Foreign Application Priority Data

Sep. 22, 2006 (FI) ................................ 20065583

(51) Int. Cl.
*H05K 5/04* (2006.01)
(52) U.S. Cl. .................. 361/609; 361/606; 361/608; 361/636; 361/640; 361/657; 312/223.2; 312/223.6; 363/141
(58) Field of Classification Search ......... 361/600–610, 361/614–616, 622–637, 640–648, 652–657, 361/801, 816, 831; 312/223.1, 223.2, 233.3, 312/236, 265.5, 265.6, 100, 111, 108, 273, 312/301, 308, 317.2, 330.1, 350; 174/50, 174/52.1, 542; 363/34, 37, 141; 200/50.21, 200/50.25, 50.27; 248/672, 678, 676, 346.01, 248/346.02, 910; 211/26, 181–183, 189, 211/191
See application file for complete search history.

(56) References Cited

U.S. PATENT DOCUMENTS

| | | | | |
|---|---|---|---|---|
| 2,885,502 A | * | 5/1959 | Eichelberger et al. | .... 200/50.25 |
| 3,229,058 A | * | 1/1966 | Schymik | ..................... 200/50.27 |
| 4,482,936 A | * | 11/1984 | Saito | ........................... 361/606 |
| 4,772,999 A | | 9/1988 | Fiorina et al. | |
| 5,481,075 A | * | 1/1996 | Kleinecke et al. | ........ 200/50.21 |
| 6,687,970 B2 | * | 2/2004 | Waechter et al. | ............ 29/426.4 |
| 7,023,712 B2 | * | 4/2006 | Miettinen | ..................... 363/34 |
| 7,486,499 B2 | * | 2/2009 | Rambo et al. | ................ 361/609 |
| 2004/0223301 A1 | | 11/2004 | Muller et al. | |

(Continued)

FOREIGN PATENT DOCUMENTS

EP   0 356 991 A2   3/1990

(Continued)

OTHER PUBLICATIONS

European Search Report issued in corresponding Application No. 07116396.8-2214 dated Oct. 5, 2009.

(Continued)

*Primary Examiner*—Michael V Datskovskiy
(74) *Attorney, Agent, or Firm*—Buchanan Ingersoll & Rooney PC

(57) ABSTRACT

The invention relates to a frequency converter, comprising: a power electronics part provided with wheels on the lower part thereof; an installation cabinet for receiving the power electronics part movable on the wheels; and connectors arranged to the power electronics part and the installation cabinet, a contact being created between the connectors when the power electronics part is installed into the installation cabinet. To facilitate electrical installation works, the power electronics part is divided at least into a base part provided with wheels and a power stage part arranged thereon, the two being detachably attached together, whereby the base part, when detached from the power stage part, can be pulled out of the installation cabinet whereas the power stage part remains in place in the installation cabinet.

10 Claims, 3 Drawing Sheets

U.S. PATENT DOCUMENTS

2005/0036248 A1 2/2005 Klikic et al.

FOREIGN PATENT DOCUMENTS

| EP | 0 446 836 A1 | 9/1991 |
| EP | 0 574 628 A1 | 12/1993 |
| EP | 1 150 555 A2 | 10/2001 |
| GB | 2 271 679 A | 4/1994 |
| WO | WO 03/041471 | 5/2003 |
| WO | WO 2006/069571 A1 | 7/2006 |

OTHER PUBLICATIONS

Finnish Search Report for 20065583 dated Jun. 18, 2007.

* cited by examiner

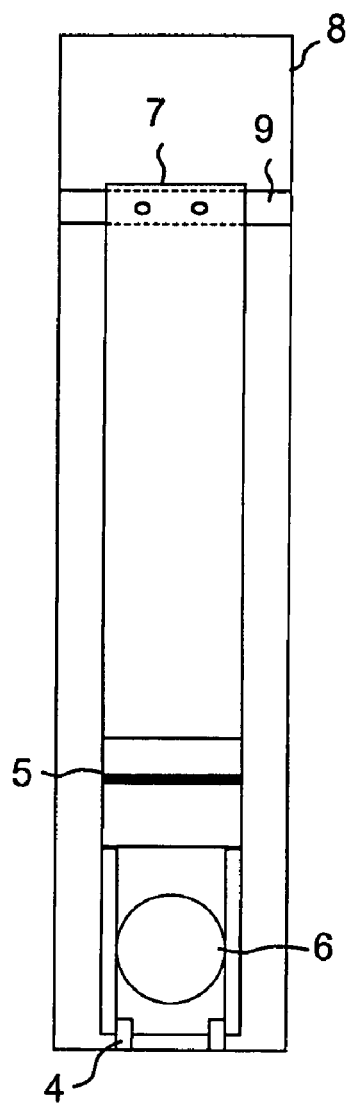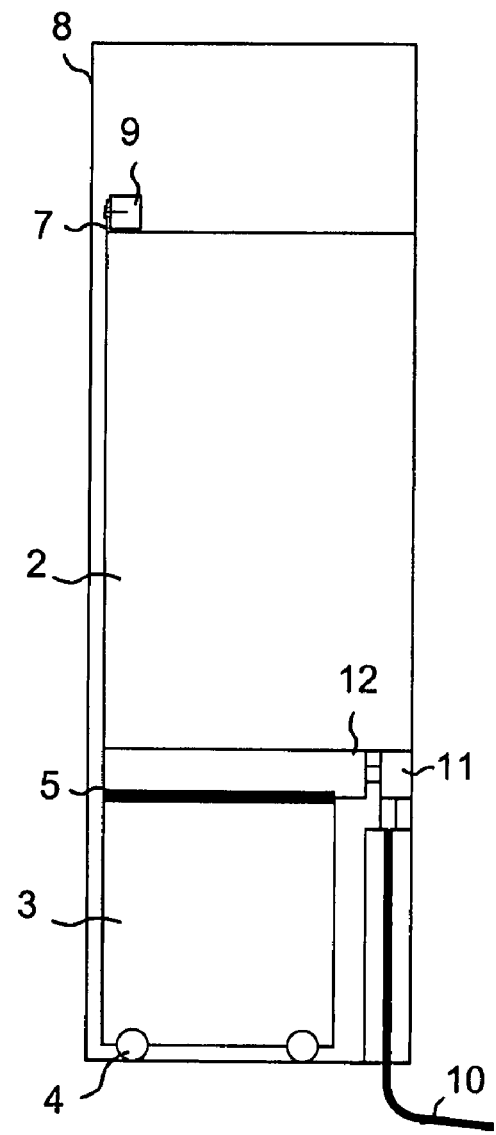

FREQUENCY CONVERTER

FIELD OF THE INVENTION

The invention relates to a frequency converter and particularly to a frequency converter that allows electrical connections to be made easier than before.

DESCRIPTION OF PRIOR ART

Prior art knows a frequency converter in which the power electronics part is provided with wheels on the lower part thereof. The wheels allow the power electronics part of the frequency converter to be pushed in place into the electrical installation cabinet in connection with assembly.

A weakness in the prior art frequency converter relates to the electrical connection works carried out at the installation site of the frequency converter. In practice electrical connections are made by drawing cables from the lower part of the electrical installation cabinet to connectors on the inside of the rear wall of the cabinet. The power electronics part is provided with counter parts for the connectors and when the power electronics part is pushed in place into the electrical installation cabinet, the counter parts are connected to the connectors.

Electrical connection works may be carried out either with the power electronics part in place in the electrical installation cabinet, or the power electronics part may be removed from the cabinet for the duration of the works. With the power electronics part in place the electrical connections are difficult to make due to lack of space. On the other hand, the power electronics part may weigh significantly more than 100 kg, which is why it is not always easy to remove for the duration of electrical installation works.

SUMMARY OF THE INVENTION

It is an object of the invention to solve the above problem and to provide a solution that facilitates electrical connection works. This is achieved by means of a frequency converter according to the accompanying claim 1.

The invention employs at least a two-piece power electronics part, a lower one of which is a base part that can be moved on wheels and pulled out of the installation cabinet without having to remove the entire power electronics part at the same time. This facilitates electrical installation works.

According to a preferred embodiment of the invention the base part is provided with a frequency converter cooling fan. This facilitates the servicing of the cooling fan, which is after all in practice almost the only part in the frequency converter that requires regular maintenance. The fact that the cooling fan is easy to remove from the installation cabinet for servicing thus facilitates maintenance.

According to another preferred embodiment of the invention the frequency converter is provided with means for reducing the force subjected to the wheels of the base part by the power stage part arranged onto the base part and attached to the installation cabinet. The base part is therefore easier to remove from the installation cabinet, because less force is needed for moving it.

The preferred embodiments of the frequency converter of the invention are disclosed in the accompanying independent claims 2 to 6.

BRIEF DESCRIPTION OF THE DRAWINGS

In the following the invention will be described in greater detail and by way of example with reference to the accompanying drawings, in which

FIGS. 3 and 4 illustrate an assembled frequency converter; and

DESCRIPTION OF AT LEAST ONE EMBODIMENT

Figure 1:
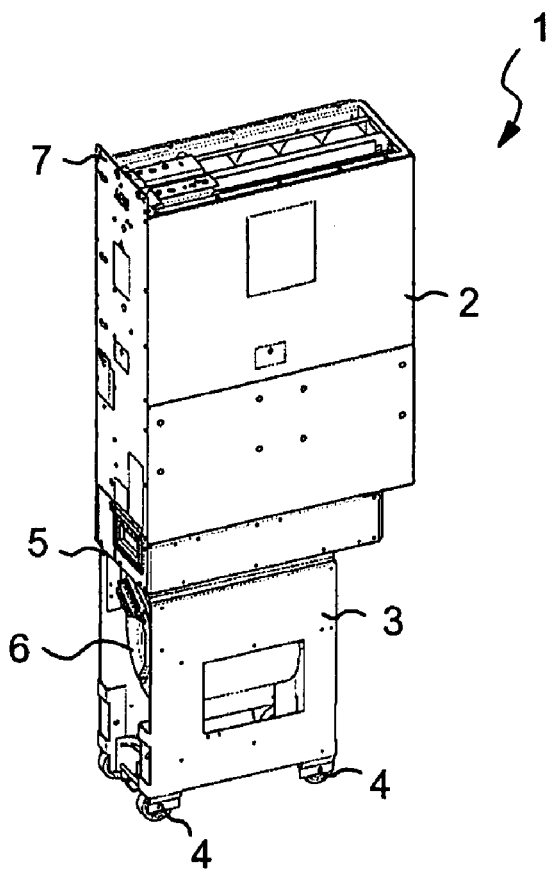
FIGS. 1 and 2 illustrate the detachment of the frequency converter parts from one another.
Figure 2:
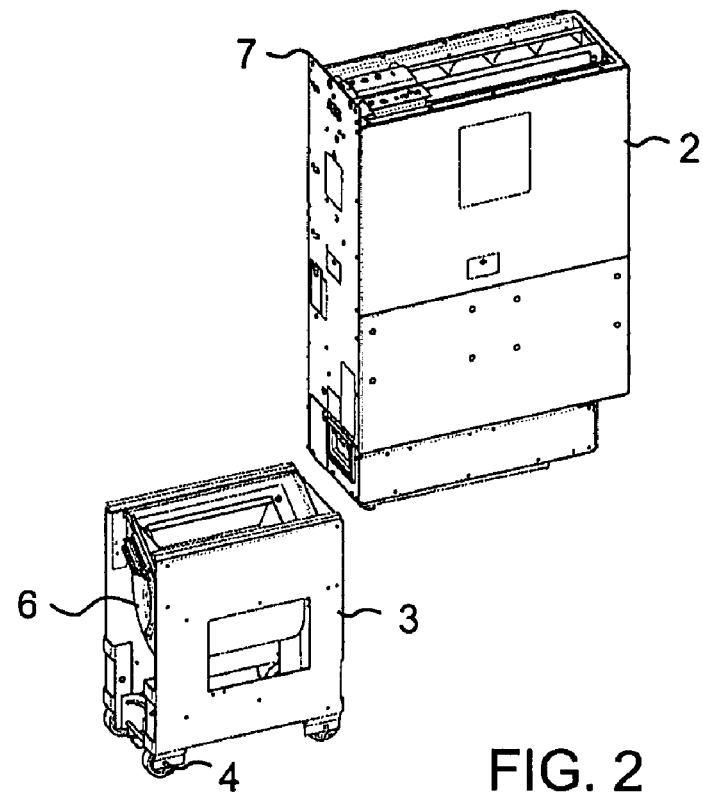

FIGS. 1 and 2 illustrate the detachment of the frequency converter parts from one another. A power electronics part 1 is divided into two parts, i.e. a power stage part 2 and a base part 3 provided with wheels 4. The base part may include a cooling fan 6 of the frequency converter for producing an air flow cooling the components in the power stage part 2. Depending on the type of implementation, the power stage part may in turn include for example semiconductors, DC capacitors, output chokes, electronics cards and cooling elements.

The power stage part 2 and the base part 3 are attached to each other at an interface 5, which may include mechanical means of attachment (such as screws) for joining the parts together and electrical connectors for creating an electrical contact between electrical devices provided in the different parts. Mechanical means of attachment ensure that the power stage part 2 and the base part 3 can be moved together on the wheels 4 without a risk of them becoming detached from one another during their displacement.

FIGS. 3 and 4 illustrate an assembled frequency converter. In FIG. 3 the frequency converter is seen from the front, i.e. from the direction of the door opening of the installation cabinet 8, with the power stage part 2 and the base part 3 of FIGS. 1 and 2 installed in place into the installation cabinet. FIG. 4 in turn shows the frequency converter from the side (with the side wall of the installation cabinet removed).

In the manufacturing process the power stage part 2 and the base part 3 are placed one on top of the other to form the power electronics part 1, which is then pushed into the installation cabinet 8 on the wheels 4. The number of the parts does not need to be precisely two, but it is conceivable to divide the power electronics part into more than two parts.

The power electronics part is attached to the installation cabinet through the upper part 7 of the front plate of the power stage part 2 and a transverse beam 9 located in the installation cabinet 8 by means of screws, for example. After this the frequency converter is delivered to the installation site.

A task to be carried out at the installation site is motor cabling, i.e. electrical installation works in which electrical cables 10 are coupled to the frequency converter. Depending on the size of the frequency converter, the cross-section of the electrical cables may be considerable, several centimeters even. Because of lack of space available in the installation cabinet, it is difficult to connect the cables.

The power electronics part 1 shown in the Figures consists of two parts, the base part 3 being detachable from the power stage part 2 (assuming the two are attached together) and thus it can be pulled out of the installation cabinet 8 on the wheels 4. The power stage part 2 remains in place in the installation cabinet supported by the upper part 7, the beam 9 and the connectors 11 or the connector body, for example. The base part 3, the weight of which is considerably lower than the total weight of the power electronics part 1, having been removed from the installation cabinet, the electric cables 10 can be connected to the connectors 11 by making use of the space thus released. Once this is done, the base part 3 can be pushed back into place on the wheels 4. In other words, a vacant space facilitating the electrical installation works can thus be created without having to move the relatively heavy power stage part. This helps to avoid subjecting the power stage part components to eventual soiling outside the installation cabinet.

In the example of FIG. 4 the connectors 11 are attached to the rear part of the installation cabinet at a location where they meet connectors 12 of the power stage part 2. Thus a contact is automatically created between the connectors 11 and 12 when the power stage part 2 is pushed in place into the installation cabinet 8.

Figure 5:
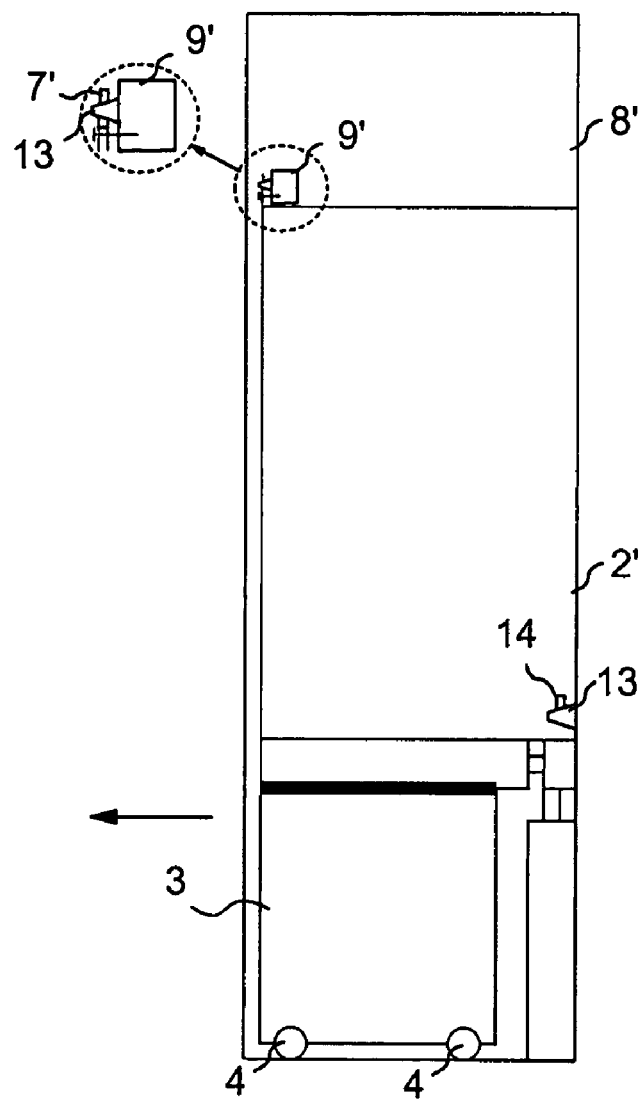
FIGS. 5 to 7 illustrate means for reducing the force subjected to the wheels of the base part of the frequency converter.
Figure 6:
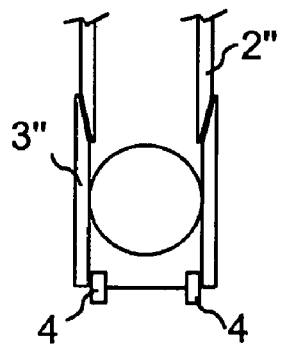
Figure 7:
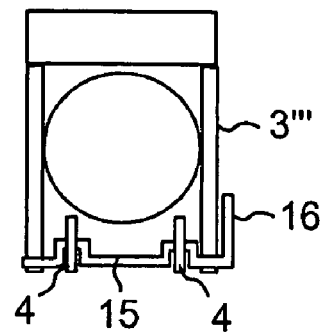

FIGS. 5 to 7 illustrate means that reduce the force subjected by the power stage part to the wheels of the frequency converter base part. The embodiments of FIGS. 5 to 7 correspond to a large extent to that of FIGS. 1 to 4 and this is why the following discussion of FIGS. 5 to 7 mainly concentrates on the differences between these embodiments.

According to the embodiment of FIG. 5 an installation cabinet 8' and a power stage part 2' are provided with surfaces 13 and 14 that come into contact with each other, at least some of the surfaces being oblique and subjecting the power stage part 2' to an upward force when the power stage part 2' and the base part 3 are pushed together in place into the installation cabinet 8' in a horizontal direction. Similarly as in the previous embodiments an upper part 7' is attached to a support beam 9' by means of screws, for example.

In FIG. 5 the oblique surfaces are provided in the form of conical guide pegs 13, with two pegs fastened into the installation cabinet 8' in the vicinity of the rear wall and at least one to the support beam 9'. The side portion of the power stage part 2' is provided with projections 14 that come into contact with the upper surfaces of the guide pegs 13 in the vicinity of the rear wall when the power stage part 2' is pushed in place into the installation cabinet 8'. Correspondingly, the upper part 7' of the front plate of the power stage part 2' is provided with an opening or openings whose edges come into contact with the upper surface of the guide peg or pegs 13 in the support beam 9' when the power stage part 2' is pushed in place into the installation cabinet and fastened there for example by means of a screw that fastens together the upper part 7' and the support beam 9'. As a result, the guide pegs 13 will bear some of the weight of the power stage part 2' installed into the installation cabinet 8. This reduces the force subjected to the wheels 4 by the power stage part 2', whereby less force is needed to pull out the base part 3 from the installation cabinet in the direction of the arrow shown in FIG. 5.

In the embodiment of FIG. 6 a base part 3" and a power stage part 2" are provided with opposite oblique surfaces at an interface between them. With the power stage part 2" attached to the installation cabinet, the force subjected to the base part 3" by the power stage part 2" and, at the same time, to the wheels can be reduced by allowing the base part 3" and the power stage part 2" to move slightly in a lateral direction with respect to each other. In other words, when the side portions of the power stage part 2" shown in FIG. 6 are moved inwards and/or the side portions of the base part 3" outwards, the oblique surfaces detach from one another and the base part 3" is easier to pull out.

In the embodiment of FIG. 7 the wheels 4 on the base part 3" are provided with eccentric shafts 15. Rotating the shafts 15 for example by turning a handle 16 at the end thereof changes the protrusion of the wheels from the base part 3''' downwards. With the power stage part attached to the installation cabin, it is possible reduce the force subjected by the power stage part to the base part 3" and, at the same time, to the wheels by changing the protrusion, whereby the base part 3''' is easier to pull out of the cabinet.

It is to be understood that the above specification and the related figures are only meant to illustrate the invention disclosed. A person skilled in the art will find it obvious that the invention may be varied and modified in different ways without departing from the scope of the claims.

The invention claimed is:

1. A frequency converter, comprising:
a power electronics part provided with wheels on the lower part thereof;
an installation cabinet for receiving the power electronics part movable on the wheels; and
connectors arranged to the power electronics part and the installation cabinet, a contact being created between the connectors when the power electronics part is installed into the installation cabinet, wherein
the power electronics part is divided at least into a base part provided with wheels and a power stage part arranged onto the base part, the two parts being detachably attached together; and in that
when detached from the power stage part, the base part can be pulled out of the installation cabinet, the power stage part remaining in place in the installation cabinet.

2. A frequency converter according to claim 1, wherein the base part is provided with a cooling fan arranged thereto.

3. A frequency converter according to claim 1, wherein the frequency converter comprises means for reducing the force subjected to the wheels of the base part by the power stage part arranged onto the base part and attached to the installation cabinet.

4. A frequency converter according to claim 1, wherein the frequency converter comprises means for reducing the force subjected to the wheels of the base part by the power stage part arranged onto the base part and attached to the installation cabinet, the means including surfaces of the installation cabinet and the power stage part that come into contact with each other, at least some of the surfaces being oblique and subjecting the power stage part to an upward force when the power stage part and the base part are pushed together in place into the installation cabinet.

5. A frequency converter according to claim 1, wherein the frequency converter comprises means for reducing the force subjected to the wheels of the base part by the power stage part arranged onto the base part and attached to the installation cabinet, the means including opposite oblique surfaces of the base part and the power stage part, the force being reduced by a lateral movement of the surfaces with respect to each other.

6. A frequency converter according to claim 1, wherein the frequency converter comprises means for reducing the force subjected to the wheels of the base part by the power stage part arranged onto the base part and attached to the installation cabinet, the means including eccentric and rotatable wheel shafts, the rotating of which changes the downward protrusion of the wheels from the base part.

7. A frequency converter according to claim 2, wherein the frequency converter comprises means for reducing the force subjected to the wheels of the base part by the power stage part arranged onto the base part and attached to the installation cabinet.

8. A frequency converter according to claim 2, wherein the frequency converter comprises means for reducing the force subjected to the wheels of the base part by the power stage part arranged onto the base part and attached to the installation cabinet, the means including surfaces of the installation cabinet and the power stage part that come into contact with each other, at least some of the surfaces being oblique and subjecting the power stage part to an upward force when the power stage part and the base part are pushed together in place into the installation cabinet.

9. A frequency converter according to claim 2, wherein the frequency converter comprises means for reducing the force subjected to the wheels of the base part by the power stage part arranged onto the base part and attached to the installation cabinet, the means including opposite oblique surfaces of the base part and the power stage part, the force being reduced by a lateral movement of the surfaces with respect to each other.

10. A frequency converter according to claim 2, wherein the frequency converter comprises means for reducing the force subjected to the wheels of the base part by the power stage part arranged onto the base part and attached to the installation cabinet, the means including eccentric and rotatable wheel shafts, the rotating of which changes the downward protrusion of the wheels from the base part.

* * * * *